(12) United States Patent
Kincade

(10) Patent No.: US 11,605,478 B2
(45) Date of Patent: Mar. 14, 2023

(54) METHOD OF REDUCING ROUGHNESS AND/OR DEFECTS ON AN OPTICAL SURFACE AND MIRROR FORMED BY SAME

(71) Applicant: Zygo Corporation, Middlefield, CT (US)

(72) Inventor: John Matthew Kincade, Vacaville, CA (US)

(73) Assignee: Zygo Corporation, Middlefield, CT (US)

(*) Notice: Subject to any disclaimer, the term of this patent is extended or adjusted under 35 U.S.C. 154(b) by 171 days.

(21) Appl. No.: 17/089,075

(22) Filed: Nov. 4, 2020

(65) Prior Publication Data

US 2021/0158989 A1    May 27, 2021

Related U.S. Application Data

(60) Provisional application No. 62/939,165, filed on Nov. 22, 2019.

(51) Int. Cl.
*G02B 5/10* (2006.01)
*G03F 7/20* (2006.01)
(Continued)

(52) U.S. Cl.
CPC .......... *G21K 1/062* (2013.01); *G02B 5/0891* (2013.01); *G02B 5/10* (2013.01); *G03F 7/70316* (2013.01)

(58) Field of Classification Search
CPC ..... G02B 5/0891; G02B 5/10; G03F 7/70316; G21K 1/06; G21K 1/062; G21K 2201/064; G21K 2201/067
See application file for complete search history.

(56) References Cited

U.S. PATENT DOCUMENTS 5,880,896 A * 3/1999 Ishii ................... G02B 26/0825
359/224.1
6,284,085 B1 9/2001 Gwo
(Continued)

FOREIGN PATENT DOCUMENTS

JP    8-201593    8/1996    ............... G21K 1/06

OTHER PUBLICATIONS

International Search Report and Written Opinion of the International Searching Authority for International Application No. PCT/US2020/058897, dated Feb. 1, 2021.
(Continued)

*Primary Examiner* — Deoram Persaud
(74) *Attorney, Agent, or Firm* — Fish & Richardson P.C.

(57) ABSTRACT

A method of making a mirror for use with extreme ultraviolet or x-ray radiation includes: i) providing a base substrate having a curved surface, wherein the curved surface deviates from a curvature of a target mirror surface at high spatial frequencies corresponding to spatial periods less than 2 mm; and ii) securing a first side of a thin plate to the curved surface of the base substrate to cover the curved surface, wherein the plate has a thickness thin enough to conform to the curvature of the target mirror surface and thick enough to attenuate deviations at the high spatial frequencies on a second side of the thin plate opposite the first side that are caused by the deviations on the curved surface of the base substrate. A mirror made by the method is also disclosed.

60 Claims, 3 Drawing Sheets

(51) Int. Cl.
   G21K 1/06      (2006.01)
   G02B 5/08      (2006.01)

(56) References Cited

U.S. PATENT DOCUMENTS 6,548,176 B1    4/2003   Gwo
2021/0124270 A1* 4/2021  Kincade .................. C03C 17/25

OTHER PUBLICATIONS

Ghigo, M. et al., "The manufacturing of the XEUS X-Ray glass segmented mirrors: status of the investigation and last results", *Proceedings of SPIE*, vol. 5168, pp. 180-195 (2004).
International Preliminary Report on Patentability for International Application No. PCT/US2020/058897, dated Jun. 2, 2022.
International Standard, ISO 10110-8, Second Edition, Optics and photonics—Preparation of drawings for optical elements and systems—Part 8: Surface texture; roughness and waviness (Oct. 1, 2010).
International Standard, ISO-10110-7, Third Edition, Optics and photonics—Preparation of drawings for optical elements and systems—Part 7: Surface imperfections (Aug. 2017).
Bhushan, B., Modem Tribology Handbook, Chapter 2, Surface Roughness Analysis and Measurement Techniques, CRC Press, LLC (2001).
Ezoe, Yuichiro et al., "Development of high-resolution light-weight x-ray optics with deformed silicon wafers", *SPIE Proceedings*, vol. 7360, pp. 73600B-1-73600B-8 (2009).
Fernandez, P.B., "Silicon Bonding Techniques for X-ray Optics", Advanced Photon Source, Argonne National Laboratory (Aug. 31, 1995).
Yao, Y., et al., "Lamination of ultra-thin silicon wafers for producing high quality and low cost X-ray telescope mirrors", *Proceedings of SPIE*, vol. 10399, pp. 1039912-1-1039912-10 (2017).

\* cited by examiner

METHOD OF REDUCING ROUGHNESS AND/OR DEFECTS ON AN OPTICAL SURFACE AND MIRROR FORMED BY SAME

CROSS REFERENCE TO RELATED APPLICATION

This application claims priority to U.S. Provisional Patent Application No. 62/939,165, filed on Nov. 22, 2019, pursuant to 35 USC § 119. The entire content of this provisional application is herein incorporated by reference in its entirety.

FIELD

This disclosure relates to reducing deviations from a target curvature for an optical surface, including mirror elements for extreme-ultraviolet (EUV) and X-ray radiation, and mirror elements formed by such methods.

BACKGROUND

Cutting-edge optical systems, such as microlithography system for making semiconductor chips, use electromagnetic radiation in the extreme-ultraviolet ("EUV") and X-ray regions. Such regions have small wavelengths in the range of 1-20 nm, which can enable the design of optical systems that can reproduce patterns with extremely fine resolution. The optical components for such systems involve reflective elements because of the strong absorption of EUV and X-ray radiation in most materials. Accordingly, such reflective elements need to have reflective surfaces of extremely high-quality, including surfaces that conform to precisely optimized curvatures (i.e., the "target curvature") and forms and that are also extremely smooth.

Techniques exist for figuring, polishing, and otherwise finishing such surfaces, including, e.g., ion-beam figuring ("IBF"), magneto-rheological finishing ("MRF"), chemical mechanical polishing ("CMP"), and computer controlled optical surfacing ("CCOS"). However, such techniques are generally expensive and time-consuming for the tolerances required for EUV and X-ray optics. Moreover, the constraints on such techniques are exacerbating by the requirement to process the non-planar surface required for the design of the reflective optical elements currently proposed for cutting-edge EUV lithography systems, including not only aspheric elements, but also non-rotationally symmetric elements such as free-form grazing incidence mirrors.

A measure commonly used to characterize the degree to which an optic surface is sufficiently "smooth" is surface roughness. Surface roughness is the repetitive and/or random deviation from the nominal surface that forms the three-dimensional topology of the surface. Especially relevant for EUV and X-ray optics is high-spatial frequency roughness ("HSFR") corresponding to deviations on the micrometer to nanometer size scale (e.g., spatial periods from about 10 microns to 10 nanometers) because such roughness causes scattering loses that lowers the transmission throughput of EUV and X-ray optical system implementing such optics. Lower spatial frequency deviations such as waviness can generally be corrected during the figuring process (at least, for example, for spatial periods greater than about 1-2 mm). Waviness can be caused by workpiece deflections, vibrations, chatters, heat treatment, or warping strains. HSFR, on the other hand, is typically an intrinsic consequence of the polishing process (e.g., randomized effects of polishing grit). HSFR includes hills (aspherities) (local maxima) and valleys (local minima) of varying amplitudes and spacings that are large compared to molecular dimensions. Mid-spatial frequency roughness ("MSFR") corresponding to deviations for spatial periods less than about 1-2 mm and greater than about 10 microns (e.g., through to the spatial periods corresponding to the HSFR) are also difficult to correct.

Roughness R is usually characterized by one of the two statistical height descriptors advocated by the American National Standards Institute (ANSI) and the International Standardization Organization (ISO) (Anonymous, 1975, 1985) (see, e.g., ISO 10110-8). These are (1) Ra, CLA (center-line average), or AA (arithmetic average) and (2) the standard deviation or variance ($\sigma$), Rq or root mean square (RMS). While not critical to the present invention, for the present application, roughness be will defined according to the root mean square of the vertical deviation of the three-dimensional surface topography from the nominal three-dimension surface topography corresponding to the design surface for the optic with respect to specified high spatial frequencies (e.g., spatial periods below 10 microns for HSFR and spatial periods below 1-2 mm for both HSFR and MSFR). For example, for a sampling region extending along a line of length L extending along an x-axis of a surface having an actual surface topography $z(x)$ relative to a nominal surface topography $z'(x)$ for scale lengths L up to 10 microns, the high spatial frequency roughness R is:

$$R = \sqrt{\frac{1}{L}\int_0^L |z(x) - z'(x)|^2 dx}$$

Roughness can be measured with an atomic force microscope ("AFM") or an optical interferometer. To make timely measurements of HSFR with nanometer-scale lateral resolutions and because HSFR is understood to result from intrinsic properties of the polishing, HSFR measurements are typically made over areas no larger than 50 microns by 50 microns, and more typically on the order 10 microns by 10 microns. For normal incidence EUV mirrors, the required tolerances for HSFR can be less than a few Angstroms (e.g., R<0.2 nm) to avoid scattering losses. Although still very strict, the tolerances can be increased somewhat for grazing incidence mirrors because scattering decreases at increased incident angles (e.g., R<0.5 nm).

SUMMARY

The inventor has recognized that the complexities of the trying to obtain optical surfaces that are sufficiently smooth for use in powered EUV optics can be greatly mitigated by exploiting plano membranes that can be super-polished much more easily then can a curved surface of a base substrate for the EUV optic. Because of its simpler geometry, a plane-parallel membrane or "thin plate" (e.g., a plane-parallel plate with thicknesses less than about 2 mm) can be readily super-polished to provide HSFR and MSFR less than about 1 nm, or less than about 0.5 nm, or even less than 0.2 nm. For example, "prime" silicon wafers are readily available from the semiconductor industry in a variety of thicknesses and sizes, and have super-polished surfaces within the roughness tolerances required for EUV optics.

Accordingly, a surface of base substrate for an EUV optic can be figured according to a target curvature (generally corresponding to spatial periods greater than 1-2 mm), and smoothed to tolerances much greater than those ultimately required for HSFR and MSFR. Deviations on this base substrate surface caused by defects and/or roughness at these higher spatial frequencies can then be reduced by securing the super-polished thin plate to this base substrate surface. The thickness of the thin plate is chosen so that the thin plate conforms to the target curvature figured into the base substrate, but smooths over deviations caused by roughness and defects at higher spatial frequencies, to yield a super-smooth optical surface having the desired target curvature. The securing of the thin plate to the base substrate can be done by any of, for example, molecular bonding, optical contacting, or adhesive bonding.

This reduction in deviations at higher spatial frequencies greatly relaxes the requirements of the base substrate to "standard" manufacturing practices without the need for extreme EUV finishing methods at surface spatial periods below the effective range of IBF. If necessary, it further enables the membrane secured to the base substrate to be corrected for errors by Ion Beam Finishing only. As result, the methods described herein enable cost-effective production of a wide class of high-quality, aspheric surfaces, such as those required for EUV optical systems.

In general, in one aspect, disclosed is a method of making a mirror for use with extreme ultraviolet or x-ray radiation. The method includes: i) providing a base substrate having a curved surface, wherein the curved surface deviates from a curvature of a target mirror surface at high spatial frequencies corresponding to spatial periods less than 2 mm; and ii) securing a first side of a thin plate to the curved surface of the base substrate to cover the curved surface, wherein the plate has a thickness thin enough to conform to the curvature of the target mirror surface and thick enough to attenuate deviations at the high spatial frequencies on a second side of the thin plate opposite the first side that are caused by the deviations on the curved surface of the base substrate. Prior to securing the thin plate to the base substrate, the second side of the thin plate is polished to reduce its surface roughness at the high spatial frequencies, and as a result, the second side of the thin plate secured to the base substrate provides a curved mirror surface for the mirror.

Embodiments of the method may include any of the following features.

The polishing of the second side of the thin plate may provide a surface roughness less than 0.5 nm for spatial periods less than 1 mm. The thin plate may have a thickness between 0.3 mm and 3 mm, for example, between 0.5 mm and 2.5 mm.

The curved mirror surface may have a roughness corresponding to that of the second side of the thin plate for spatial periods less than the thickness of the thin plate. The curved mirror surface provided by the second side of the thin plate may have a surface roughness less than 0.5 nm for spatial periods less than 1 mm. The curved mirror surface provided by the second side of the thin plate may have a surface roughness less than 0.5 nm for spatial periods less than 10 microns.

The second side of the thin plate may be inspected with an optical microscope over an area of 1 mm$^2$ to characterize the number of defects on the second side of the thin plate. The inspection may be before the thin plate is secured to the substrate or after the thin plate is secured to the substrate or both before and after the thin plate is secured to the substrate. The second side of the thin plate may have less than 1 defect per 1 square millimeter over the usable area of the curved mirror surface. Moreover, the curved mirror surface provided by the second side of the thin plate may have less than 1 defect per 1 square millimeter over the usable area of the curved mirror surface. For example, the defects may include any of scratches, pits, and digs having at least one lateral dimension smaller than 500 nm.

The mirror may be for use in a wavelength range between 1 and 20 nm. The target mirror surface may have a curvature with an absolute sagittal dimension greater than at least 10 microns. The high spatial frequencies for deviations may include spatial frequencies corresponding to spatial periods between 0.25 mm and 1.5 mm.

The deviations on the curved surface of the base substrate may correspond to a surface roughness greater than 10 nm for at least some spatial periods less than 2 mm. The deviations on the curved surface of the base substrate may correspond to a surface roughness greater than 2 nm for at least some spatial periods less than 10 microns. The curved surface of the base substrate may include more than 1 defect per 1 square millimeter over the usable area of the curved mirror surface. The securing may include adhesively bonding the first side of thin plate to the curved surface of the base substrate, for example, the adhesively bonding may include using epoxy and/or UV-curing cement as the adhesive.

The deviations on the curved surface of the base substrate may correspond to a surface roughness less than 20 nm for at least some spatial periods less than 2 mm. The deviations on the curved surface of the base substrate may correspond to a surface roughness less than 5 nm for at least some spatial periods less than 10 microns. The first side of the thin plate may be polished to provide a surface roughness less than 2 nm for spatial periods less than 10 microns. The securing may include molecular bonding the first side of the thin plate to the curved surface of the base substrate. The base substrate may include any of silicon, fused silica, quartz silicon, and titanium-doped silica. The securing may also include optical contacting the first side of the thin plate to the curved surface of the base substrate. For example, the optical contacting may be done at atmospheric pressures.

More generally, the base substrate may include any of Cordierite, other ceramics, silicon, fused silica, quartz silica, and titanium-doped silica. Similarly, the thin plate may include any of Cordierite, other ceramics, silicon, fused silica, quartz silica, and titanium-doped silica.

The method may further include figuring the curved surface of the base substrate by ion beam figuring prior to securing the first surface of the thin plate to the curved surface.

The method may further include inspecting the curved mirror surface provided by the second side of the thin plate to characterize the reduction in deviations at the high spatial frequencies.

The method may further include coating the second side of the thin plate with multiple optical layers to provide a reflective mirror surface for the EUV or X-ray radiation. For example, the multiple layers may include layers of molybdenum and silicon.

In general, in another aspects, disclosed is a mirror for use with extreme ultraviolet or x-ray radiation. The mirror includes: i) a base substrate having a curved surface, wherein the curved surface deviates from a curvature of a target mirror surface at high spatial frequencies corresponding to spatial periods less than 2 mm; and ii) a thin plate having a first side secured to the curved surface of the base substrate to cover the curved surface, wherein the plate has a thickness thin enough to conform to the curvature of the target mirror surface and thick enough to attenuate deviations at the high spatial frequencies on a second side of the thin plate opposite the first side that are caused by the deviations on the curved surface of the base substrate. The thin plate is polished to reduce its surface roughness at the high spatial frequencies, and as a result, the second side of the thin plate secured to the base substrate provides a curved mirror surface for the mirror.

Embodiments of the mirror may include any of the following features.

The second side of the thin plate may be polished to provide a surface roughness less than 0.5 nm for spatial periods less than 1 mm. The thin plate may have a thickness between 0.3 mm and 3 mm, for example, between 0.5 mm and 2.5 mm.

The curved mirror surface may have a roughness corresponding to that of the second side of the thin plate for spatial periods less than the thickness of the thin plate. The curved mirror surface provided by the second side of the thin plate may have a surface roughness less than 0.5 nm for spatial periods less than 1 mm. The curved mirror surface provided by the second side of the thin plate may have a surface roughness less than 0.5 nm for spatial periods less than 10 microns.

The second side of the thin plate may have less than 1 defect per 1 square millimeter over the usable area of the curved mirror surface. Moreover, the curved mirror surface provided by the second side of the thin plate may have less than 1 defect per 1 square millimeter over the usable area of the curved mirror surface. For example, the defects may include any of scratches, pits, and digs having at least one lateral dimension smaller than 500 nm.

The mirror may be for use in a wavelength range between 1 and 20 nm. The target mirror surface may have a curvature with an absolute sagittal dimension greater than at least 10 microns. The high spatial frequencies for deviations may include spatial frequencies corresponding to spatial periods between 0.25 mm and 1.5 mm.

The deviations on the curved surface of the base substrate may correspond to a surface roughness greater than 10 nm for at least some spatial periods less than 2 mm. The deviations on the curved surface of the base substrate may correspond to a surface roughness greater than 2 nm for at least some spatial periods less than 10 microns. The curved surface of the base substrate may include more than 1 defect per 1 square millimeter over the usable area of the curved mirror surface. The first side of the thin plate may be adhesively secured to the curved surface of the base substrate, for example, by using epoxy and/or UV-curing cement as the adhesive.

The deviations on the curved surface of the base substrate may correspond to a surface roughness less than 20 nm for at least some spatial periods less than 2 mm. The deviations on the curved surface of the base substrate may correspond to a surface roughness less than 5 nm for at least some spatial periods less than 10 microns. The first side of the thin plate may be polished to provide a surface roughness less than 2 nm for spatial periods less than 10 microns. The first side of the thin plate may be secured to the curved surface of the base substrate by molecular bonding. The base substrate may include any of silicon, fused silica, quartz silicon, and titanium-doped silica. The first side of the thin plate may be secured to the curved surface of the base substrate by optical contacting. For example, the optical contacting may be done at atmospheric pressures.

More generally, the base substrate may include any of Cordierite, other ceramics, silicon, fused silica, quartz silica, and titanium-doped silica. Similarly, the thin plate may include any of Cordierite, other ceramics, silicon, fused silica, quartz silica, and titanium-doped silica.

The coating on the second side of the thin plate may include multiple optical layers to provide a reflective mirror surface for the EUV or X-ray radiation. For example, the multiple layers may include layers of molybdenum and silicon.

All documents referred to herein are incorporated by reference in their entirety. In case of conflict with the present disclosure, and any document incorporated by reference, the present disclosure controls.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
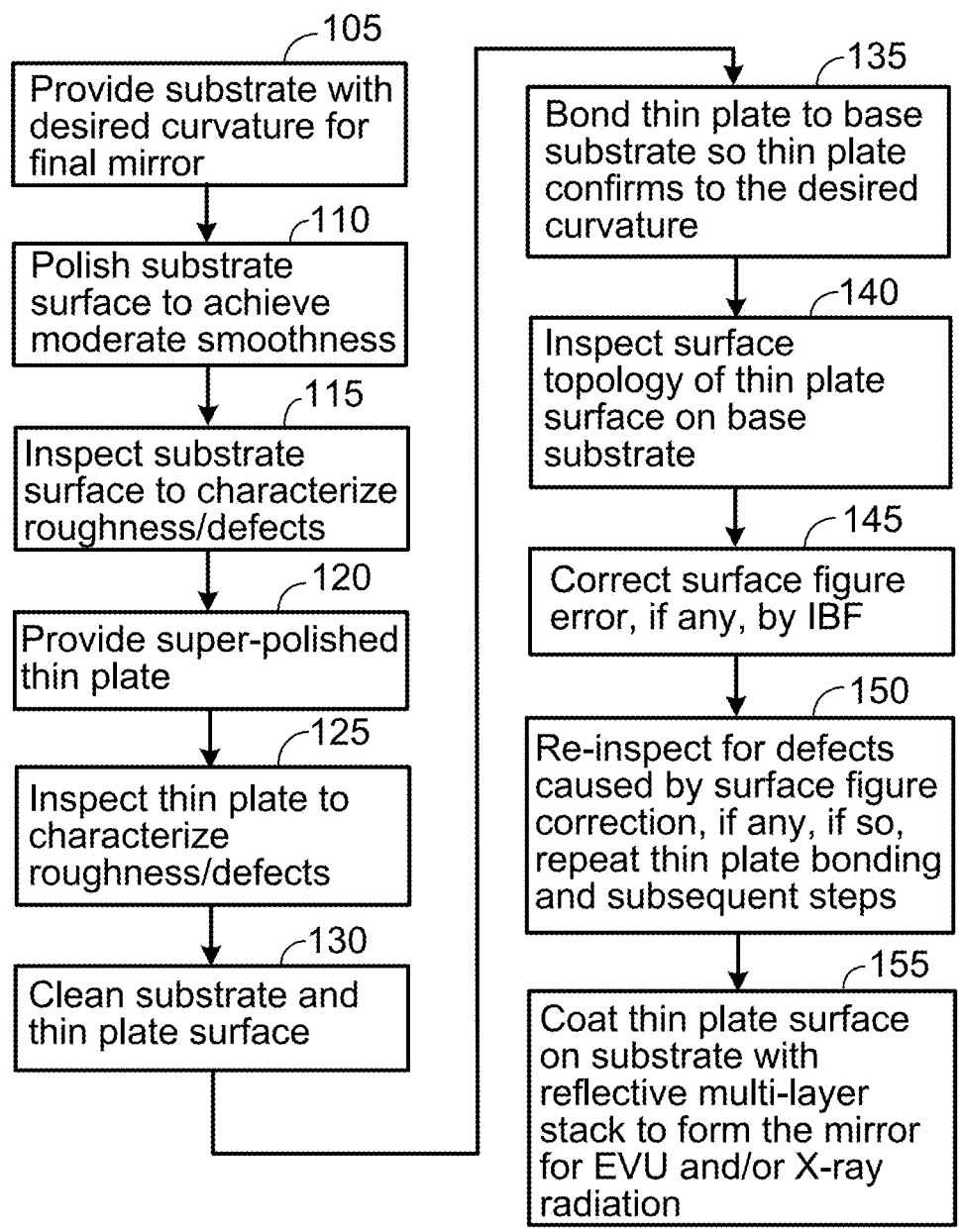
FIG. 1 is a flow chart describing embodiments for making a curved mirror for use with extreme ultraviolet (EUV) or X-ray radiation.

FIG. 1 is a flow chart describing embodiments for making a curved reflective element (i.e., a curved mirror) for use with extreme ultraviolet (EUV) or X-ray radiation.

In step 105, a substrate is provided. The substrate can be made of material typically used in EUV and X-ray optical systems. Preferably the material is compatible with the subsequent deposition of alternating multiple thin layers such as molybdenum and silicon to provide Bragg reflectivity for the final mirror. For example, the substrate material can be silicon, fused silica, titanium-oxide doped silica, and ULE®-glass from Corning. Furthermore, the substrate material can be a glass ceramic or another polishable ceramic, such as cordierite. The substrate has a surface topology corresponding to a desired curvature for the final mirror. For example, the curvature can be spherical or aspherical, but rotationally symmetric. Furthermore, the curvature can be a free-form curvature that is not rotationally symmetric. A desired rotationally symmetric curvature can be achieved by using conventional diamond turning machines. Further refinements, including localized and/or free-form deviations from rotational symmetry can be achieved by ion-beam figuring ("IBF"). To distinguish from substrates intended to be nominally planar, for example, the substrate curvature can have an absolute sagittal dimension greater than at least 10 microns, or even greater than 100 microns.

Figure 2:
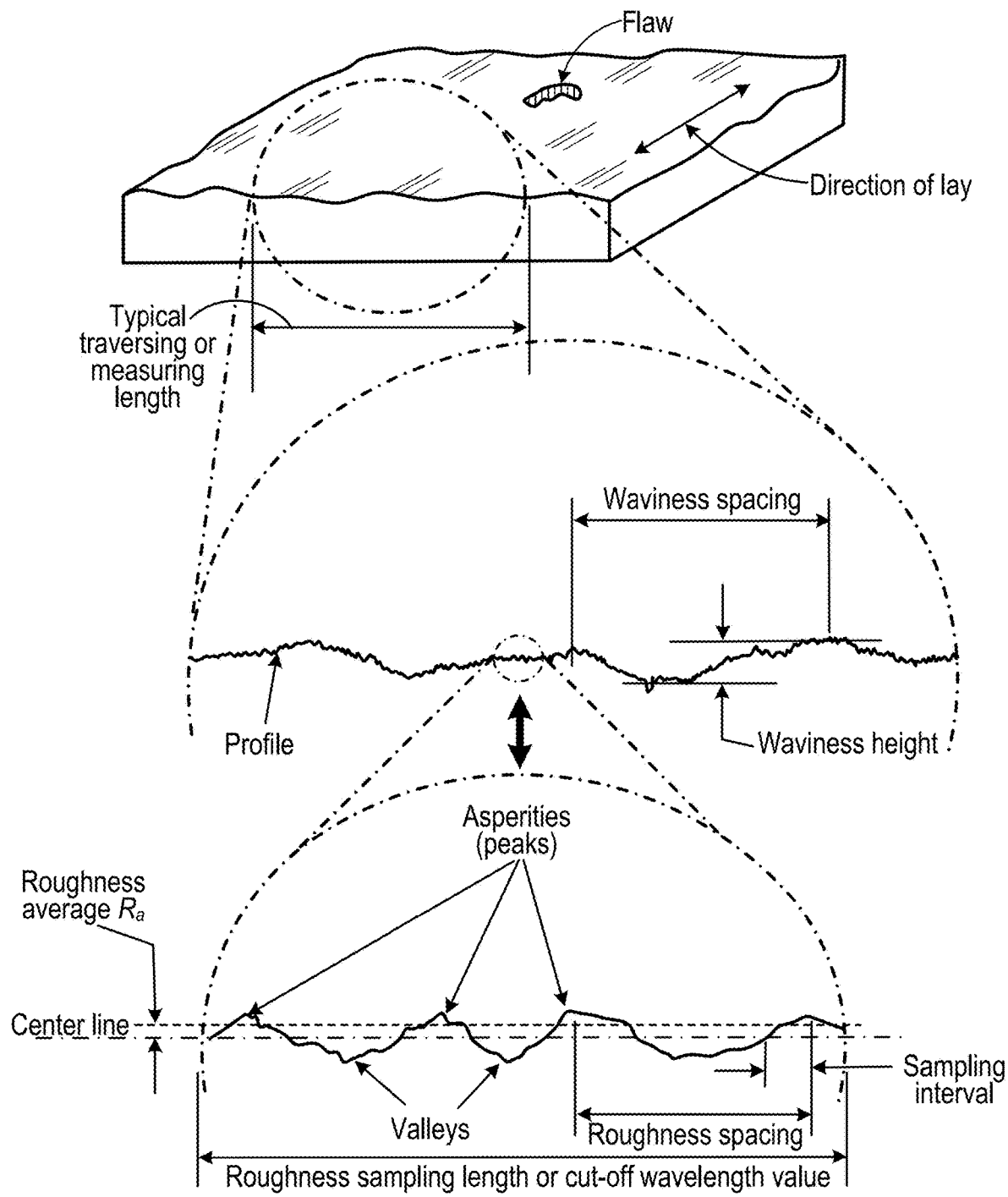
FIG. 2 is a schematic that depicts roughness R, including low and high spatial frequency roughness, on a substrate surface.

In step 110, the curved surface of the substrate is polished to reduce its roughness. An advantage of the method disclosed herein is that the tolerances for such polishing can still be relatively high. For example, in many embodiments, it is sufficient for the high spatial frequency roughness ("HSFR") to be no less than 1 nm, or even no less than 2 nm, or even not less than 5 nm for at least some spatial periods less than 10 microns. Similarly, in many embodiments, it is sufficient for the mid spatial frequency roughness ("MSFR") of the curved surface of the substrate to be no less than 5 nm, or even no less than 10 nm, or even no less than 20 nm, for at least some spatial periods less than 2 mm. Such polishing can be done using conventional polishing techniques such as MRF and CMP. As noted above, HSFR can be measured according to ISO 10110-8. FIG. 2 is a schematic figure from Chapter 2, Section 2.2 of the Modern Tribology Handbook by B. Bhushan that depicts roughness R, including HSFR, on a substrate surface.

This roughness for the curved surface of the substrate is too high for use as an EUV optic. Moreover, even if the HSFR were much lower, the curved surface may still suffer from defects that would preclude its used as an EUV optic. Any area on the surface of a material that is discontinuous and discreet that does not follow the natural texture of the surface or its roughness is classified as a defect (or equivalently a "flaw"). For example, defects include scratches, pits, and digs. Such defects can often be overlooked when inspecting an optical surface for HSFR because HSFR measurements can be time-consuming and are therefore usually determined from a relatively small area of the entire usable optical area. For the EUV and X-ray optics that are of particular interest here, the defects can include, for example, any of scratches, pits, and digs having at least one lateral dimension smaller than, for example, 1000 nm, or even smaller than 500 nm.

In step 115, the curved surface of the substrate is inspected to characterize its roughness and determine the number of defects it has, if any. For example, roughness can be measured with an AFM or an optical interferometer. The identification and quantification of defects can be done, for example, with a confocal microscope. If the results from the inspection show that the curved substrate does not meet certain minimal requirements for a bonding process discussed further below, then the substrate is further processed to improve its roughness and/or reduce the number of defects, or the substrate is replaced with another substrate having the surface with the target curvature than does meet the minimal requirements. Nonetheless, the tolerances for roughness and/or number of defects are substantially reduced using the methods disclosed herein relative to those for a usable, final EUV optic.

In step 120, a thin plate (also referred to herein as a "plano membrane") is provided. The thin plate has generally parallel sides whose surfaces have been super-polished to meet the roughness requirements for EUV optics. For example, one or both sides of the thin plate may polished to provide a roughness of less than 0.5 nm, or even less than 0.2 nm, for spatial periods less than 1 mm. This is possible because of its simple geometry. For example, super-polished "prime" silicon wafers are readily available from the semiconductor industry in a variety of thicknesses and sizes, and can provide HSFR and MSFR having such values. More generally, for example, the thin plate may be made from any of silicon, fused silica, quartz (crystalline) silica, titanium-doped silica, or ultra-low thermal expansion ceramics like Cordierite that can be super-polished.

Moreover, the thin plate can also generally be selected to have many fewer defects than what is easily possible for the curved substrate. For example, certain EUV optics require fewer than 1 defect per 1 square millimeter area over the entire usual area of the optic, e.g., 1 to 100,000 square millimeters in area or even larger. Because of its plano geometry, this stringent requirement is much more easily obtained for the thin plate, than for the curved substrate. Accordingly, for certain embodiments, the thin plate is selected to have not only the roughness requirements described above, but also to have fewer than 1 defect per 1 square millimeter over the usable area of the curved mirror surface.

The thickness of the thin plate is chosen so that on the one hand it is sufficiently thin so that it is flexible enough to conform to the target curvature of the base substrate without fracturing or any other damage when secured to the base substrate. On the other hand, the thin plate is sufficiently thick that when it is secured to the base substrate it greatly attenuates HSFR, MSFR, and/or defects on the base substrate and thereby provides a much higher quality optical surface for the substrate that retains the target curvature. Generally, the thickness of the plate on the order of the greatest spatial period for the deviations that are desired to be attenuated. For example, in many embodiments, the thickness is in the range of about 0.5 to 5 mm.

In step 125, the thin plate is inspected to ensure its roughness and number of defects are within tolerances. For example, roughness can be measured with an AFM or an optical interferometer. The identification and quantification of defects can be done, for example, with a confocal microscope over an area greater than 1 mm$^2$. If the thin plate is not within tolerances, it is either re-polished or replaced with another sample.

In step 130, the base substrate and thin plate are both cleaned in preparation for securing thin plate to the base substrate. The preparation can include, for example, one or more of: i) cleaning the substrate surface with a detergent; ii) flushing the substrate surface with de-ionized water; iii) further cleaning the substrate surface with a solvent; and iv) drying the substrate surface with an inert gas such as nitrogen with a nitrogen gun.

Figure 3A:
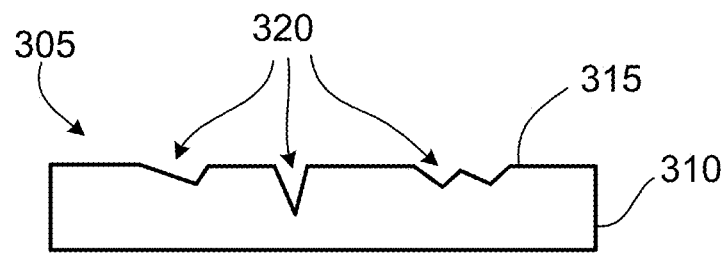
FIGS. 3A-C is a schematic depiction of a bonding process for forming the mirror, including: depicting a base substrate having the target curvature but deviations caused by roughness and/or defects (FIG. 3A); depicting the bonding of a super-smooth thin plate on the base substrate to cover the deviations but otherwise conform to the target curvature (FIG. 3B); and depicting the final mirror having the target curvature with a smooth surface (FIG. 3C).
Figure 3B:
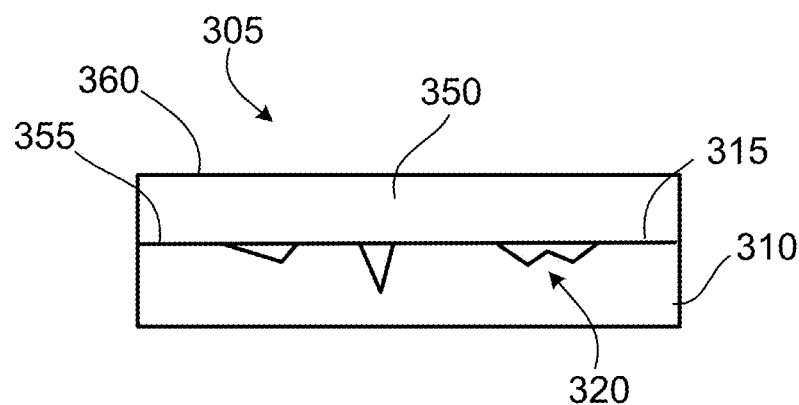
Figure 3C:
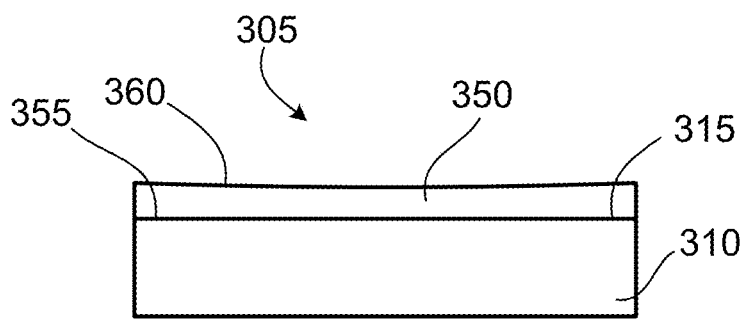

In step 135, the thin plate is secured to the base substrate. More specifically, as shown in FIG. 3A, an EUV optic 305 has a substrate base 310 (e.g., made of a ULE glass) with a curved surface 315 having a target curvature, but which has defects and/or roughness 320 greater than the required tolerances for the final EUV optic. As shown in FIG. 3B, a super-polished thin plate 350, such as a prime silicon wafer, is secured to the substrate base 310 to cover over roughness/defects 320, but otherwise conform to the target curvature of curved surface 315. (For convenience only, FIGS. 3A-3B exaggerate the relative size of the defects and roughness, and also depicts the target curvature as nominally flat.) Specifically, thin plate 350 has a first side 355 that is bonded or otherwise attached to base substrate 310 to cover curved surface 315. A second side 360 of the thin plate has been super-polished to provide a smooth mirror surface for EUV optic 305 having the target curvature. This is also shown in FIG. 3C, which shows thin plate 350 bonded to substrate base 310 to provide smooth mirror surface 360 with the target curvature for EUV optic 305 (and where, for convenience, FIG. 3C no longer depicts the underlying defects/roughness 320). Also note that for convenience, the thin plate 350 and base substrate 310 are depicted in FIGS. 3A-3C as having comparable thicknesses, but in fact the base substrate is much thicker, e.g., more than 10 times thicker, than the thin plate. In particular, the base substrate must be thick enough and of sufficient stiffness to retain and impart the target curvature to the thin plate when the thin plate is secured to the base substrate.

Different techniques can be used to secure the thin plate to the base substrate. In certain embodiments, a molecular bonding technique is used such those taught in U.S. Pat. Nos. 6,284,085 and 6,548,176, the contents of which are incorporated herein by reference. Specifically, this technique can be used when first surface of the thin plate and the curved surface of the base substrate comprise materials capable of forming a silicate-like network bond between said first surface and said second surface through hydroxide catalyzed hydration and dehydration. For example, such materials include: natural quartz, fused quartz, fused silica, ultra-low thermal expansion coefficient ("ULE") glass, borosilicate, opal, granite, silica and silicon-oxides. This technique can also be used when the thin plate is a silicon wafer because the exposed surfaces of the silicon wafer will oxidize to form an silicon oxide layer. After both surfaces are cleaned (as described, for example, in step 130), the two surfaces to be bonded are brought into close contact with another in the presence of a hydroxide source to form the silicate-like network bond. For example, the hydroxide source can be an aqueous hydroxide, such as any of sodium hydroxide, potassium hydroxide, ammonium hydroxide, sodium ethoxide or potassium ethoxide. The resulting silicate bonds can be as precise and transparent as optical contact bonds, and also as strong and reliable as high temperature frit bonds. To help minimize surface figure mismatches during the molecular bonding between the curved surface of the base substrate and the first side of the thin plate, the two surfaces preferably each have a roughness of less than 20 nm for spatial periods less than 1 mm and less than 5 nm for spatial periods less than 10 microns.

In other embodiments, the well-known technique of optical contacting can be used to bond the thin plate to the substrate base. This can be done when the first surface of the thin plate and the curved surface of the base substrate comprise the same glass material (e.g., silicon oxide, including that formed naturally on a silicon wafer) and when the two surfaces are sufficiently clean and smooth. For example, the two surfaces preferably each have a roughness of less than 20 nm for spatial periods less than 1 mm and less than 2 nm for spatial periods less than 10 microns. To form the optical contact, the two cleaned surfaces are brought into contact with one another under modest pressure (e.g., atmospheric pressure can be sufficient) so that the surfaces are conformal to an accuracy of less than about 1-2 nm to allow intermolecular forces to bond the two surfaces together.

In yet further embodiments, adhesive bonding can be used to bond the thin plate to the substrate base. Adhesive bonding has the advantage that it lessens the requirements on matching materials and surface smoothness present in the molecular and optical bonding techniques described above. Suitable adhesives include epoxy and/or UV-curing cement.

In step 140, the resulting curved mirror surface 360 from the combined thin-plate and base substrate assembly is inspected for topology using an optical interferometer to ensure that the surface figure error for the target curvature remains within specification. If not, a surface figure error map determined from the inspection in step 140 is then used in step 145 to guide surface figure correction using, for example, IBF.

In step 150, the figure-corrected curved mirror surface is again inspected for roughness and defects to ensure that the no additional deviations were introduced during the surface figure correction. If so, than the thin plate bonding and subsequent steps are optionally repeated.

In step 155, after it is has been established that the figure-corrected curved mirror surface 360 is within desired tolerances with respect to surface figure error, roughness, and number of defects, the substrate surface is optionally coated with multiple optical layers, such as alternating thin layers such of molybdenum and silicon to provide Bragg reflectivity for the substrate and form the final mirror for the EUV and/or X-ray optical system. Techniques for forming such multi-layer stacks are well-known in the art.

Further embodiments of the invention include, for example, the mirror formed by the method of the flow chart of FIG. 1.

Scope

It must be noted that as used herein and in the appended claims, the singular forms "a", "an", and "the" include plural referents unless the context clearly dictates otherwise, e.g., when the word "single" is used.

As used herein, the terms "adapted" and "configured" mean that the element, component or other subject matter is designed and/or intended to perform a given function. Thus, the use of the terms "adapted" and "configured" should not be construed to mean that a given element, component, or other subject matter is simply "capable of" performing a given function.

As used herein, the phrases "at least one of" and "one or more of," in reference to a list of more than one entity, means any one or more of the entity in the list of entity, and is not limited to at least one of each and every entity specifically listed within the list of entity. For example, "at least one of A and B" (or, equivalently, "at least one of A or B," or, equivalently, "at least one of A and/or B") may refer to A alone, B alone, or the combination of A and B.

As used herein, the term "and/or" placed between a first entity and a second entity means one of (1) the first entity, (2) the second entity, and (3) the first entity and the second entity. Multiple entity listed with "and/or" should be construed in the same manner, i.e., "one or more" of the entity so conjoined. Other entity may optionally be present other than the entity specifically identified by the "and/or" clause, whether related or unrelated to those entities specifically identified.

While this specification contains many specific implementation details, these should not be construed as limitations on the scope of any inventions or of what may be claimed, but rather as descriptions of features specific to particular embodiments of particular inventions.

Certain features that are described in this specification in the context of separate embodiments can also be implemented in combination in a single embodiment. Conversely, various features that are described in the context of a single embodiment can also be implemented in multiple embodiments separately or in any suitable subcombination.

Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

A number of embodiments of the invention have been described. Nevertheless, it will be understood that various modifications may be made without departing from the spirit and scope of the invention. Accordingly, other embodiments are within the scope of the following claims.

What is claimed is:

1. A method of making a mirror for use with extreme ultraviolet or x-ray radiation, the method comprising:
   a. providing a base substrate having a curved surface, wherein the curved surface deviates from a curvature of a target mirror surface at high spatial frequencies corresponding to spatial periods less than 2 mm; and
   b. securing a first side of a thin plate to the curved surface of the base substrate to cover the curved surface, wherein the plate has a thickness thin enough to conform to the curvature of the target mirror surface and thick enough to attenuate deviations at the high spatial frequencies on a second side of the thin plate opposite the first side that are caused by the deviations on the curved surface of the base substrate,
   c. wherein, prior to securing the thin plate to the base substrate, the thin plate is a plane-parallel plate and the second side of the thin plate is polished when the thin plate is a plane-parallel plate to reduce the surface roughness of the second side of the thin plate at the high spatial frequencies, and
   d. wherein the second side of the thin plate secured to the base substrate provides a curved mirror surface for the mirror.

2. The method of claim 1, wherein the polishing of the second side of the thin plate provides a surface roughness less than 0.5 nm for spatial periods less than 1 mm.

3. The method of claim 1, wherein the second side of the thin plate is inspected with an optical microscope over an area of 1 mm$^2$ to characterize the number of defects on the second side of the thin plate.

4. The method of claim 3, wherein the inspection is before the thin plate is secured to the substrate or after the thin plate is secured to the substrate or both before and after the thin plate is secured to the substrate.

5. The method of claim 3, wherein the defects comprise any of scratches, pits, and digs having at least one lateral dimension smaller than 500 nm.

6. The method of claim 1, wherein the second side of the thin plate has less than 1 defect per 1 square millimeter over the usable area of the curved mirror surface.

7. The method of claim 1, wherein the curved mirror surface has a roughness corresponding to that of the second side of the thin plate for spatial periods less than the thickness of the thin plate.

8. The method of claim 1, wherein the curved mirror surface provided by the second side of the thin plate has a surface roughness less than 0.5 nm for spatial periods less than 1 mm.

9. The method of claim 8, wherein the curved mirror surface provided by the second side of the thin plate has less than 1 defect per 1 square millimeter over the usable area of the curved mirror surface.

10. The method of claim 1, wherein the curved mirror surface provided by the second side of the thin plate has a surface roughness less than 0.5 nm for spatial periods less than 10 microns.

11. The method of claim 10, wherein the curved mirror surface provided by the second side of the thin plate has less than 1 defect per 1 square millimeter over the usable area of the curved mirror surface.

12. The method of claim 1, wherein the mirror is for use in a wavelength range between 1 and 20 nm.

13. The method of claim 1, wherein the target mirror surface has a curvature with an absolute sagittal dimension greater than at least 10 microns.

14. The method of claim 1, wherein the high spatial frequencies include spatial frequencies corresponding to spatial periods between 0.25 mm and 1.5 mm.

15. The method of claim 1, wherein the deviations on the curved surface of the base substrate correspond to a surface roughness greater than 10 nm for at least some spatial periods less than 2 mm.

16. The method of claim 15, wherein the deviations on the curved surface of the base substrate correspond to a surface roughness greater than 2 nm for at least some spatial periods less than 10 microns.

17. The method of any of claim 1, wherein the curved surface of the base substrate comprises more than 1 defect per 1 square millimeter over the usable area of the curved mirror surface.

18. The method of claim 1, wherein the securing comprises adhesively bonding the first side of thin plate to the curved surface of the base substrate.

19. The method of claim 18, wherein the adhesively bonding comprises using epoxy and/or UV-curing cement as the adhesive.

20. The method of claim 1, wherein the deviations on the curved surface of the base substrate correspond to a surface roughness less than 20 nm for at least some spatial periods less than 2 mm.

21. The method of claim 20, wherein the deviations on the curved surface of the base substrate correspond to a surface roughness less than 5 nm for at least some spatial periods less than 10 microns.

22. The method of claim 1, wherein the first side of the thin plate is polished to provide a surface roughness less than 2 nm for spatial periods less than 10 microns.

23. The method of claim 22, wherein the securing comprise molecular bonding the first side of the thin plate to the curved surface of the base substrate.

24. The method of claim 23, wherein the base substrate comprises any of silicon, fused silica, quartz silicon, and titanium-doped silica.

25. The method of claim 22, wherein the securing comprises optical contacting the first side of the thin plate to the curved surface of the base substrate.

26. The method of claim 25, wherein the optical contacting is done at atmospheric pressures.

27. The method of claim 1, wherein the base substrate comprises any of Cordierite, other ceramics, silicon, fused silica, quartz silica, and titanium-doped silica.

28. The method of claim 1, wherein the thin plate comprises any of Cordierite, other ceramics, silicon, fused silica, quartz silica, and titanium-doped silica.

29. The method of claim 1, wherein thin plate has a thickness between 0.3 mm and 3 mm.

30. The method of claim 1, wherein thin plate has a thickness between 0.5 mm and 2.5 mm.

31. The method of claim 1, further comprising figuring the curved surface of the base substrate by ion beam figuring prior to securing the first surface of the thin plate to the curved surface.

32. The method of claim 1, further comprising inspecting the curved mirror surface provided by the second side of the thin plate to characterize the reduction in deviations at the high spatial frequencies.

33. The method of claim 1, further comprising coating the second side of the thin plate with multiple optical layers to provide a reflective mirror surface for the EUV or X-ray radiation.

34. The method of claim 33, wherein the multiple layers comprises layers of molybdenum and silicon.

35. The method of claim 1, wherein the polishing of the second side of the thin plate provides a high-spatial frequency roughness (HSFR) and mid-spatial frequency roughness (MSFR) surface roughness less than 0.2 nm.

36. A mirror for use with extreme ultraviolet or x-ray radiation, the mirror comprising:
   a. a base substrate having a curved surface, wherein the curved surface deviates from a curvature of a target mirror surface at high spatial frequencies corresponding to spatial periods less than 2 mm; and
   b. a thin plate having a first side secured to the curved surface of the base substrate to cover the curved surface, wherein the plate has a thickness thin enough to conform to the curvature of the target mirror surface and thick enough to attenuate deviations at the high spatial frequencies on a second side of the thin plate opposite the first side that are caused by the deviations on the curved surface of the base substrate,
   c. wherein
      i. the thin plate is polished as a plane-parallel plate prior to securing the first side of the thin plate to the curved surface of the base substrate to reduce the surface roughness of the second side of the thin plate at the high spatial frequencies to less than 0.5 nm for spatial periods less than 1 mm, and
      ii. the second side of the thin plate secured to the base substrate provides a curved mirror surface for the mirror.

37. The mirror of claim 36, wherein the polishing of the second side of the thin plate provides a high-spatial frequency roughness (HSFR) and mid-spatial frequency roughness (MSFR) less than 0.2 nm.

38. The mirror of claim 36, wherein the second side of the thin plate has less than 1 defect per 1 square millimeter over the usable area of the curved mirror surface.

39. The mirror of claim 38, wherein the defects comprise any of scratches, pits, and digs having at least one lateral dimension smaller than 500 nm.

40. The mirror of claim 36, wherein the curved mirror surface has a roughness corresponding to that of the second side of the thin plate for spatial periods less than the thickness of the thin plate.

41. The mirror of claim 36, wherein the curved mirror surface provided by the second side of the thin plate has a surface roughness less than 0.5 nm for spatial periods less than 1 mm.

42. The mirror of claim 36, wherein the curved mirror surface provided by the second side of the thin plate has a surface roughness less than 0.5 nm for spatial periods less than 10 microns.

43. The mirror of claim 41, wherein the curved mirror surface provided by the second side of the thin plate has less than 1 defect per 1 square millimeter over the usable area of the curved mirror surface.

44. The mirror of claim 42, wherein the curved mirror surface provided by the second side of the thin plate has less than 1 defect per 1 square millimeter over the usable area of the curved mirror surface.

45. The mirror of claim 36, wherein the mirror is for use in a wavelength range between 1 and 20 nm.

46. The mirror of claim 36, wherein the target mirror surface has a curvature with an absolute sagittal dimension greater than at least 10 microns.

47. The mirror of claim 36, wherein the high spatial frequencies include spatial frequencies corresponding to spatial periods between 0.25 mm and 1.5 mm.

48. The mirror of claim 36, wherein the deviations on the curved surface of the base substrate correspond to a surface roughness greater than 10 nm for at least some spatial periods less than 2 mm.

49. The mirror of claim 48, wherein the deviations on the curved surface of the base substrate correspond to a surface roughness greater than 2 nm for at least some spatial periods less than 10 microns.

50. The mirror of claim 36, wherein the curved surface of the base substrate comprises more than 1 defect per 1 square millimeter over the usable area of the curved mirror surface.

51. The mirror of claim 36, wherein the first side of thin plate is adhesively bonded to the curved surface of the base substrate.

52. The mirror of claim 36, wherein the first side of thin plate is molecularly bonded to the curved surface of the base substrate.

53. The mirror of claim 52, wherein the base substrate comprises any of silicon, fused silica, quartz silicon, and titanium-doped silica.

54. The mirror of claim 36, wherein the first side of thin plate is optically contacted to the curved surface of the base substrate.

55. The mirror of claim 36, wherein the base substrate comprises any of Cordierite, other ceramics, silicon, fused silica, quartz silica, and titanium-doped silica.

56. The mirror of claim 36, wherein the thin plate comprises any of Cordierite, other ceramics, silicon, fused silica, quartz silica, and titanium-doped silica.

57. The mirror of claim 36, wherein thin plate has a thickness between 0.3 mm and 3 mm.

58. The mirror of claim 57, wherein thin plate has a thickness between 0.5 mm and 2.5 mm.

59. The mirror of claim 36, further comprising a coating on the second side of the thin plate comprising multiple optical layers to provide a reflective mirror surface for the EUV or X-ray radiation.

60. The mirror of claim 59, wherein the multiple layers comprises layers of molybdenum and silicon.

* * * * *